(12) United States Patent
Lin

(10) Patent No.: US 6,351,035 B2
(45) Date of Patent: Feb. 26, 2002

(54) STRAIN RELEASE CONTACT SYSTEM FOR INTEGRATED CIRCUITS

(75) Inventor: Mou-Shiung Lin, Hsinchu (TW)

(73) Assignee: M. S. Lin, Hsin-Chu (TW)

( * ) Notice: Subject to any disclaimer, the term of this patent is extended or adjusted under 35 U.S.C. 154(b) by 0 days.

(21) Appl. No.: 09/727,869

(22) Filed: Dec. 4, 2000

Related U.S. Application Data

(62) Division of application No. 09/249,252, filed on Feb. 12, 1999, now Pat. No. 6,159,773.

(51) Int. Cl.⁷ .............................................. H01L 23/34
(52) U.S. Cl. ...................................... 257/727; 438/117
(58) Field of Search ................................ 257/665, 669, 257/670, 738, 772, 780, 788, 792, 727; 438/15, 25, 26, 117

(56) References Cited

U.S. PATENT DOCUMENTS

| 5,317,479 A | * | 5/1994 | Pai et al. ..................... 361/773 |
| 5,663,596 A | | 9/1997 | Little .......................... 257/727 |
| 5,665,648 A | | 9/1997 | Little .......................... 438/117 |
| 5,831,331 A | | 11/1998 | Lee ............................. 257/659 |
| 6,032,356 A | * | 3/2000 | Eldridge et al. .............. 29/843 |
| 6,224,396 B1 | * | 5/2001 | Chan et al. ................... 439/71 |

* cited by examiner

Primary Examiner—David Nelms
Assistant Examiner—Quoc Huang
(74) Attorney, Agent, or Firm—George O. Saile; Stephen B. Ackerman

(57) ABSTRACT

The problem of stress transmission from the outside of an integrated circuit package into the interior of the semiconductor has been significantly reduced by placing a microspring between the external solder ball and the interior tab. The process for manufacturing such a structure begins with a fully completed integrated circuit on whose surface freestanding metal posts are formed, each post being in contact with an I/O pad. Using a leveling plate at elevated temperature, the posts are given a permanent tilt relative to the surface and are then encapsulated in an elastomer. This subprocess may then be repeated as many times as desired with the direction in which the posts lean being changed by 90 degrees at each iteration. This results in the formation of an orthogonal spiral which acts as a coil spring to absorb stress originating at the solder ball.

9 Claims, 5 Drawing Sheets

STRAIN RELEASE CONTACT SYSTEM FOR INTEGRATED CIRCUITS

This is a division of patent application Ser. No. 09/249,252, filing date Feb. 12, 1999, now U.S. Pat. No. 6,159,773 Strain Release Contact System For Integrated Circuits, assigned to the same assignee as the present invention.

FIELD OF THE INVENTION

The invention relates to the general field of integrated circuit packaging with particular reference to the absorption of stress at the contacts.

BACKGROUND OF THE INVENTION

In the macro world (measured in fractions of an inch) spring loaded contacts are widely used because of their ability to absorb stresses associated with pressing two surfaces together. This is of particular importance if either, or both, surface is fragile and subject to damage if the contact force were to be transmitted to it. Contacting systems of this type are commonly formed by seating a ball in a cylindrical cavity, behind an opening that is slightly smaller than the diameter of the ball, and mounting a coil spring between the ball and the other end of the cylinder.

Similar stresses are associated with contacting systems that are used in the micro world (measured in microns and fractions thereof) but, to the best of our knowledge, spring loaded contacts similar to those described above have not yet been developed. A particular example of a micro system in which a fragile set of surfaces need to make and maintain good contact with a second set of surfaces, is a packaged integrated circuit where contact pads that are part of a chip need to make contact with solder balls located on the outside of the package. These solder balls will be used later to attach the package to the next packaging level (for example a printed circuit board) and it is important that the associated thermal and mechanical stresses not be transmitted down to the chip level.

The reason that spring loaded contacts have thus far not been used in the micro world is due, we believe, to the difficulty of fabricating a truly three dimensional object such as a coil spring (as opposed to a multi-layer structure with vertical connections between layers).

The closest prior art to (though still substantially different from) the present invention that we have found are a pair of patents by Little (U.S. Pat. No. 5,663,596—structure) and (U.S. Pat. No. 5,665,648—method). In Little's invention, chip contacting pads are located on the vertical edges of the integrated circuit chip. The latter is attached to a substrate through spring contacts that have a base portion joined to a line on the substrate and a spring portion that presses against the edge of the chip. To fabricate the spring, a release layer is first laid down. Then a metal film is deposited under conditions known to induce high tensile stress so that, when the release layer is etched away, the freed metal curls up to a sufficient degree to allow the chip to be pushed against its underside, thereby forming a spring contact.

While Little's structure is not a coil, coil-like structures have been described in the prior art for use as micro inductors. These structures are, however, not truly three dimensional and comprise multiple layers of open rings that are then connected in series by means of vertical vias. An example of this is described by Lee (U.S. Pat. No. 5,831,331). Such structures, while working as inductors, could not be used to provide stress relief as each ring is separated from its neighbors by a rigid layer. Even if the latter was made to be flexible, absorption of stress would be limited to the vias which have very little flexibility so that any, except very small, stresses would be transmitted between contacting surfaces.

SUMMARY OF THE INVENTION

It has been an object of the present invention to provide a structure capable of absorbing stress between an integrated circuits package and the semiconductor.

Another object of the invention has been to provide a process for manufacturing said structure.

A still further object of the invention has been that said process be fully compatible with existing manufacturing techniques for integrated circuits.

These objects have been achieved by introducing a microspring between the solder ball and the contact tab. The process for manufacturing such a structure begins with a fully completed integrated circuit on whose surface freestanding metal posts are formed, each post being in contact with an I/O tab. Using a leveling plate at elevated temperature, the posts are given a permanent tilt relative to the surface and are then encapsulated in an elastomer. This subprocess may then be repeated as many times as desired with the direction in which the posts lean being changed by 90 degrees at each iteration. This results in the formation of an orthogonal spiral which acts as a coil spring that absorbs stress originating at the solder ball.

DESCRIPTION OF THE PREFERRED EMBODIMENTS

We will disclose the present invention through a description of the process for its manufacture. This will also serve as a description of the structure of the invention.

Figure 1:
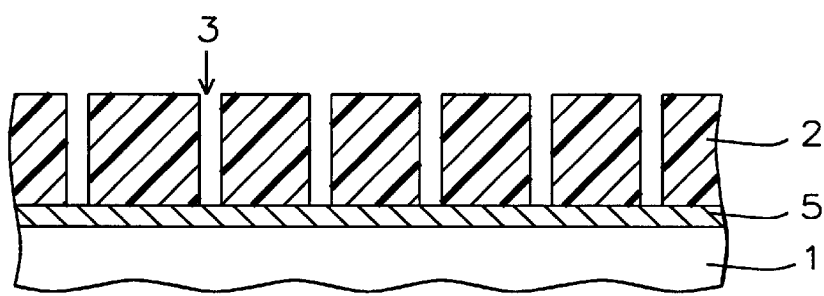
FIG. 1 shows a silicon wafer with a fully completed integrated circuit which is the starting point for the process of the present invention. It has been coated with a blanket layer of metal followed by layer of photoresist.

Referring now to FIG. 1, the process of the present invention begins with the provision of silicon wafer 1 which has reached the end of the IC manufacturing cycle so that it contains at least one fully completed integrated circuit, including a final passivation layer (if used) and, particularly, contact pads on the surface that connect to various points inside the integrated circuit. A blanket layer 5 of metal such as gold, copper, or silver is deposited on the surface of wafer 1 to a thickness between about 500 and 7,000 Angstroms. This is then coated with photoresist; layer 2 to a thickness between about 5 and 200 microns. This particular thickness is carefully controlled since it will determine the lengths of the various posts (or rods) that make up the structure. Using standard photolithographic techniques, layer 2 is then processed to form a mask that is present everywhere except for holes, such as 3, over the contact pads. The diameter of these holes, which is typically between about 5 and 100 microns, is also carefully controlled since this will determine the diameters of posts. Electrical contact is made to the blanket layer 5 so that, by means of electroplating, holes 3 can be filled with metal. Our preferred metal for this has been gold but other metals such as copper, solder, silver, or aluminum could also have been used.

Figure 2:
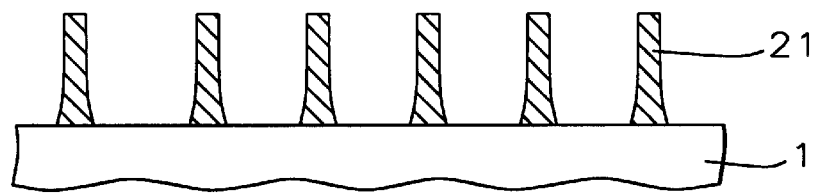
FIG. 2 shows how freestanding metal posts are formed after the holes in the photoresist have been filled by electroplating and the photoresist stripped away.

Referring now to FIG. 2, the photoresist is now removed, leaving behind free standing metal posts 21. Next, blanket layer 5 is removed by etching in $Kl/l_2$ solution (in the case of gold) just long enough to not affect posts 21 (typically between about 1 and 20 minutes). Note that the posts have a slightly thickened appearance at their base. This is achievable through appropriate use of the negative photoresist. Although not explicitly illustrated, each post 21 is now attached to a single contact pad.

Figure 3:
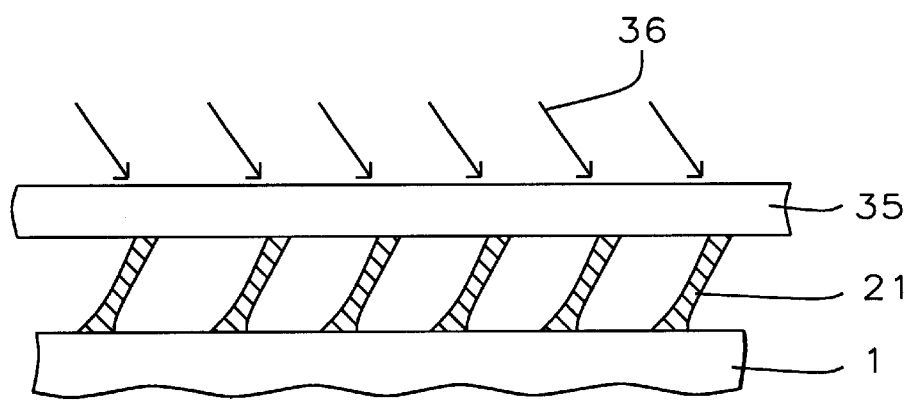
FIG. 3 shows how a leveling plates is used to tilt the metal posts.

A key feature invention is illustrated in FIG. 3. After heating the structure to a temperature between about 100 and 450° C., leveling plate 35 is lowered onto the structure so that its under-surface is in uniform contact with the top ends of all metal posts 21. A leveling plate needs to have a melting point greater than that of the post metal and must not react with it. Typically a stainless steel plate about 2 cm. thick, having a surface that is optically flat, has been preferred. Through robotic control, a uniform force is applied to the top surface 35. This force (symbolized by arrows 36) is at an angle of approximately 45° to the horizontal, resulting in posts 21 becoming tilted at an angle of between about 15 and 75 degrees relative to the substrate. Since the chosen temperature is above the point at which plastic flow of the metal begins, once tilted and then cooled down again, posts 21 retain their orientation relative to the surface after the leveling plate 35 is removed.

Figure 4:
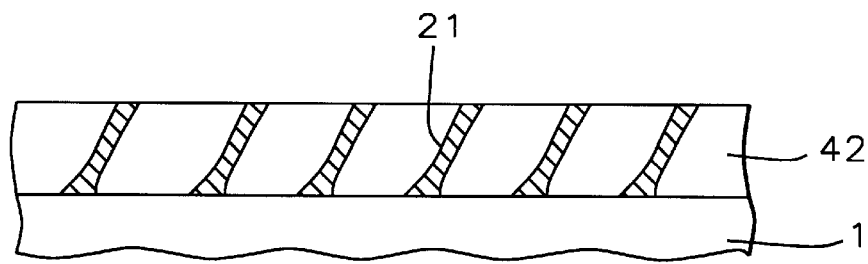
FIG. 4 is FIG. 3 after encapsulation in an elastomer.

Once the sloping posts have been formed, with the leveling plate still in position they are encapsulated in elastomer layer 42, as shown in FIG. 4, after the leveling plate has cooled down. The structure is placed in a moderate vacuum (around 0.1 torr), elastomer material, such as silicone elastomer, is dispensed along the wafer edge, following which the pressure is returned to atmospheric, allowing the elastomer to be sucked into the gap. Once the elastomer has filled all empty space between the leveling plate and the wafer surface, the former is removed. Thus, while the posts are fully covered, their free ends are left uncovered. Our preferred elastomer material has been silicone elastomer, but other materials such as polyimides or benzocyclobutene (BCB) could also have been used.

Figure 5:
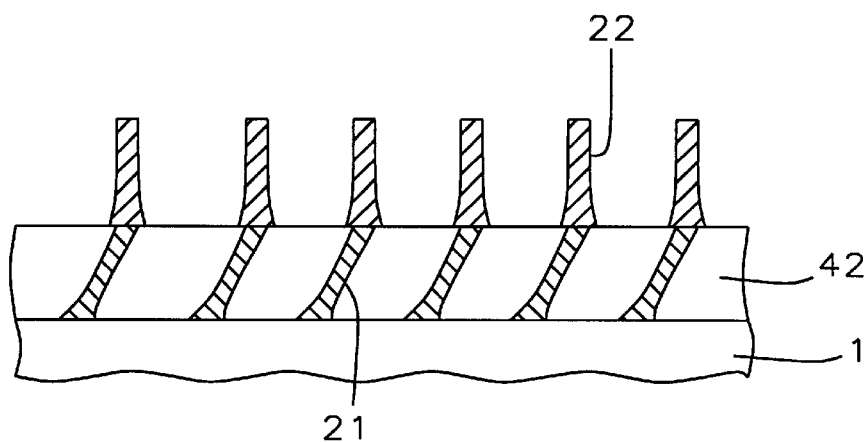
FIG. 5 illustrates how multiple iterations of the basic process may be performed.

Referring now to FIG. 5, the above process is repeated so that posts 22 are formed, each member of 22 being attached to a free (uncovered) end of a post 21. As before, a leveling plate is used on metal posts 22 to tilt them away from the vertical. Although the angle of tilt is the same as before, the direction in which the posts are pushed is such that posts 22 end up pointing in a direction that is orthogonal to that to which posts 21 point.

Figure 6:
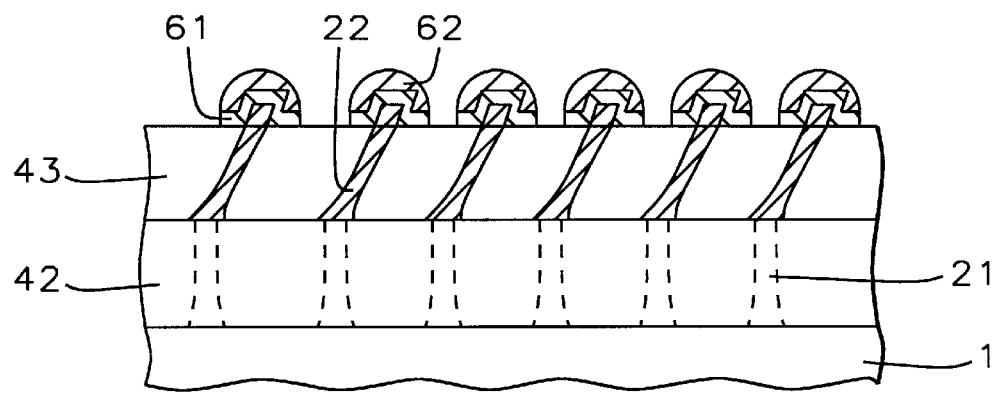
FIG. 6 shows a structure limited to 2 iterations followed by the formation of solder balls on the top surface.

This is schematically illustrated in FIG. 6 where posts 21 have been drawn with broken lines to signify that are pointing in a direction that is normal to the plane of the figure while posts 22 are drawn with solid lines to signify that they lie in the plane of the figure. If desired, the process of the present invention could be terminated at this point. If this option is elected, then, following the introduction of second elastomer layer 43, contacts to the outer world are formed at the top surface of 43. First, pads 61 of an underlayer barrier metal such as chromium/chrome-copper/copper or similar copper metal systems are formed over all uncovered ends of posts 22 following which solder balls 62 are grown over and around pads 61 by means of electroplating or screen printing. Our preferred material for the solder balls has been eutectic solder but other compositions including high temperature solders, $Sn_5Pb_{95}$, or other no lead solder, such as indium-tin could also have been used. The solder balls had diameters between about 10 and 500 microns and are spaced, on average, a distance of between about 10 and 1,000 microns apart.

Figure 7:
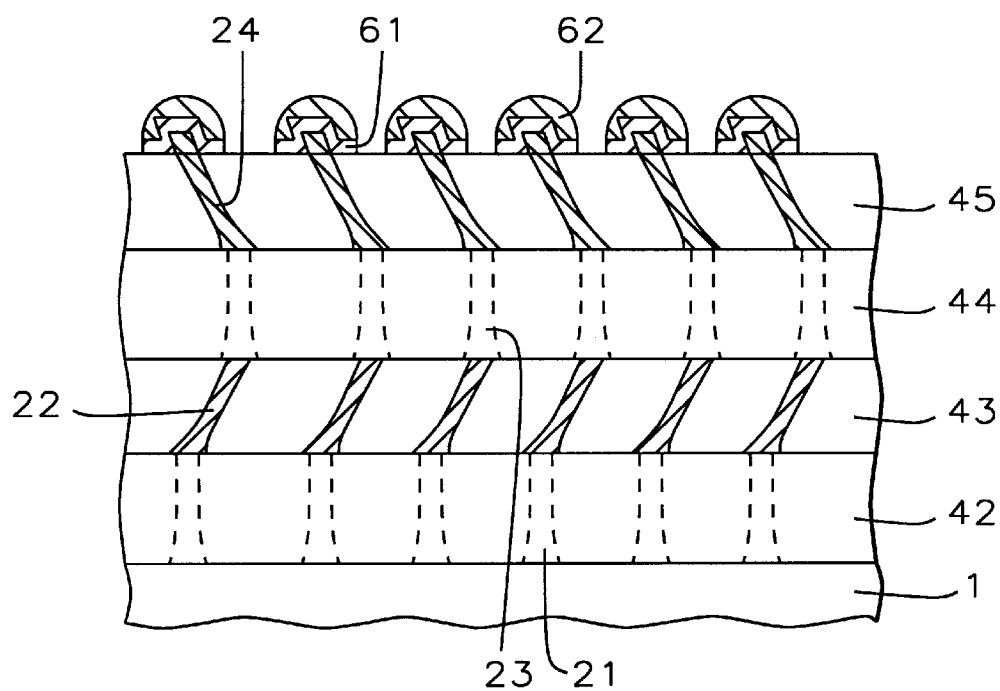
FIG. 7 is an example of a structure made with four iterations.

In the likely event that it was elected to not terminate the process after only two iterations, the above described steps may be repeated as many times as desired (in most cases this would be up to about 4 additional times). In FIG. 7 we illustrate a schematic cross-section of a structure in which 4 iterations were performed. As in FIG. 6, broken lines signify that posts are pointing into (or out of the plane of the figure. Note that although posts 24 have been drawn with solid lines, they are not actually in the plane of the figure but in a plane parallel to it.

Figure 8:
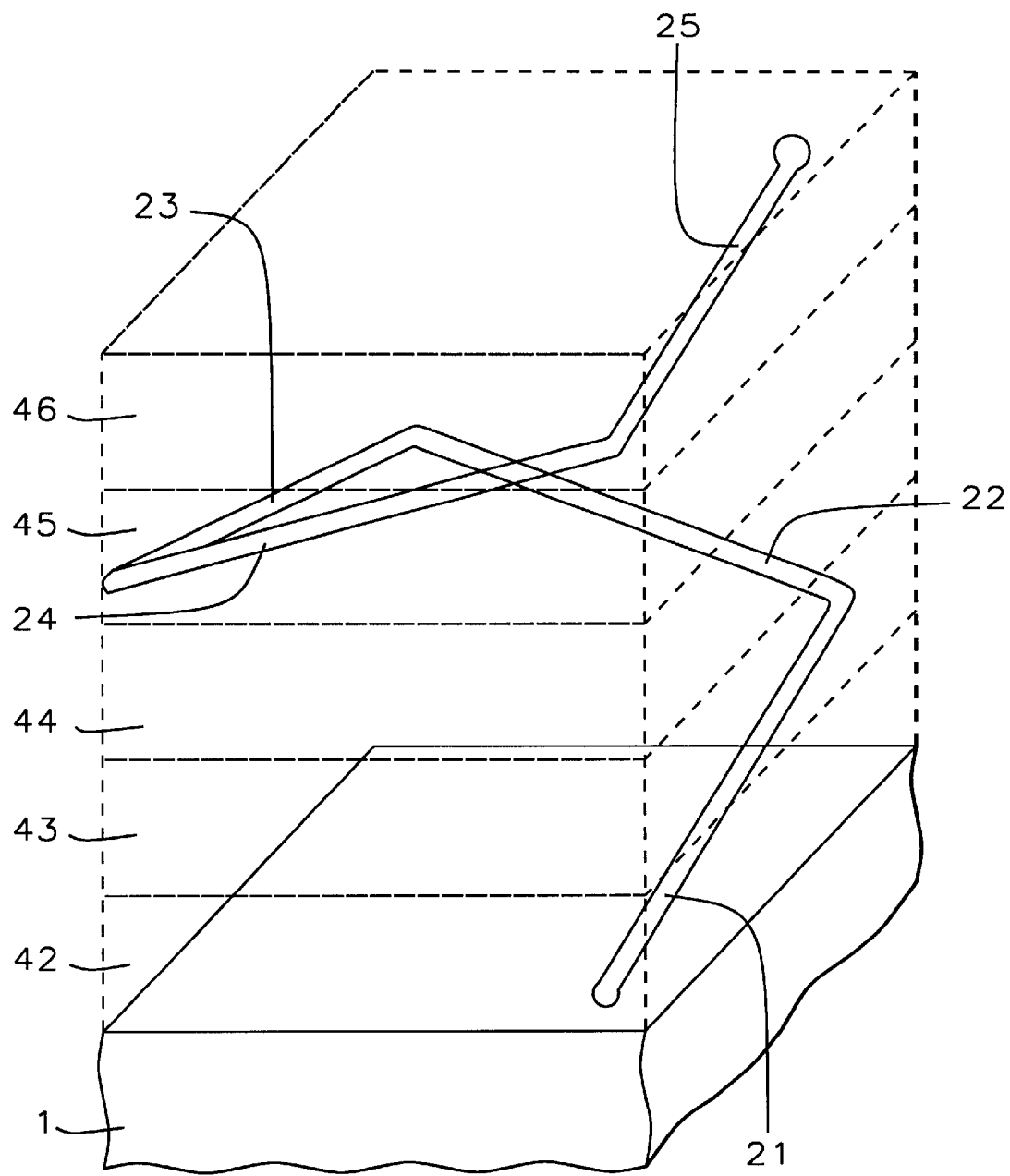
FIG. 8 shows an isometric view of an orthogonal spiral that was formed by using the process of the present invention.

FIG. 8 is an isometric view of the structure of the present invention. Five iterations of post formation are shown in this case. Top surface barrier pads and solder balls are not shown in the figure and the successively formed layers of elastomer are shown with broken lines although, in practice, they would form a single uniform layer in the final structure. The illustration shows how, through application of the present invention, a structure, functionally equivalent to a coil spring has been formed. We refer to this as an 'orthogonal spiral' since it is made up of straight line segments that are orthogonally disposed relative to one another.

Figure 9:
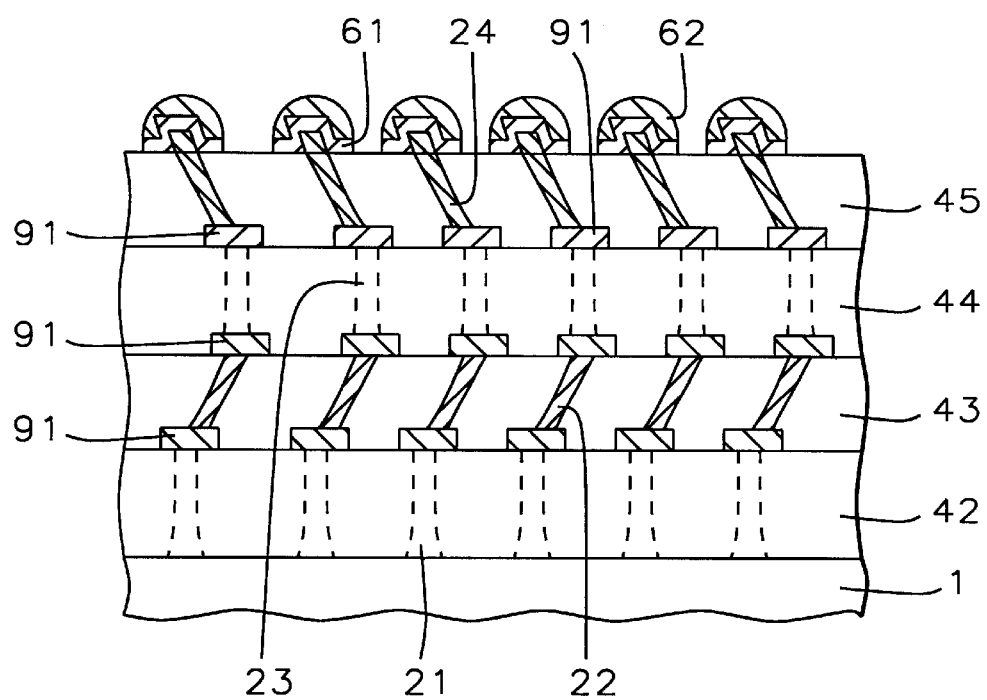
FIG. 9 is similar to FIG. 7 except for the addition of joint strengthening pads at the intersections of the posts.

In FIG. 9 we show an alternative optional embodiment of the invention. As in the previously described structures, that of FIG. 9 shows a series of posts (rods) 21 through 24 joined to form an orthogonal spiral. They have been encapsulated in elastomer through successive application of layers 42–45. The key feature of this embodiment is the presence of joint strengthening discs 91 between the rods. These discs were formed, in each iterations, directly after the introduction of the elastomer. At that point in the process a layer of joint strengthening metal such as gold, copper, or nickel was deposited onto the elastomer. It was then patterned and etched to form joint strengthening discs 91 which were symmetrically disposed on and around the uncovered ends of the rods.

While the invention has been particularly shown and described with reference to the preferred embodiments thereof, it will be understood by those skilled in the art that various changes in form and details may be made without departing from the spirit and scope of the invention.

What is claimed is:

1. A low stress contacting system for an integrated circuit, comprising:
   a silicon wafer containing a completed integrated circuit and having an upper surface on which there is contact pad connected to said integrated circuit;
   a number of metal rods, including a first rod and a last rod, attached end-to-end to each other in the form of an orthogonal spiral;

all rods being tilted at an angle relative to said upper surface;

the first rod being attached to a contact pad;

the last rod being attached to a solder ball;

elastomer, covering said upper surface and extending upwards therefrom to fully encapsulate all the rods while leaving said solder ball uncovered; and an underlayer barrier metal pad between the solder ball and the last rod.

2. The contacting system of claim 1 wherein the elastomer is selected from the group consisting of silicone elastomer, polyimides and benzocyclobutene.

3. The contacting system of claim 1 further comprising joint strengthening discs between the rods.

4. The contacting system of claim 1 wherein said number of rods is between 2 and about 10.

5. The contacting system of claim 1 wherein the angle at which the rods are tilted is between about 15 and 75 degrees.

6. The contacting system of claim 1 wherein the rod has a diameter between about 5 and 100 microns and a length between about 5 and 200 microns.

7. The contacting system of claim 1 wherein the solder balls have a diameter between about 10 and 500 microns.

8. The contacting system of claim 1 wherein the solder balls are selected from the group consisting of eutectic solder, high temperature solders, and no lead solders.

9. The contacting system of claim 1 wherein the solder balls are spaced, on average, a distance of between about 10 and 1,000 microns apart.

* * * * *